United States Patent
Heinen et al.

(10) Patent No.: US 10,790,688 B2
(45) Date of Patent: Sep. 29, 2020

(54) METHOD FOR MEASURING BATTERY PARAMETERS UNDER DISCHARGE OR CHARGE

(71) Applicant: Faraday&Future Inc., Gardena, CA (US)

(72) Inventors: Garrett David Heinen, San Luis Obispo, CA (US); Anil Paryani, Cerritos, CA (US); Nabiha Naquib Iqra, Los Angeles, CA (US)

(73) Assignee: Faraday & Future Inc., Gardena, CA (US)

( * ) Notice: Subject to any disclaimer, the term of this patent is extended or adjusted under 35 U.S.C. 154(b) by 270 days.

(21) Appl. No.: 15/275,204

(22) Filed: Sep. 23, 2016

(65) Prior Publication Data

US 2017/0082695 A1 Mar. 23, 2017

Related U.S. Application Data

(60) Provisional application No. 62/222,347, filed on Sep. 23, 2015.

(51) Int. Cl.
*G01R 31/367* (2019.01)
*H02J 7/00* (2006.01)
*H01M 10/42* (2006.01)
*G01R 31/385* (2019.01)
*H01M 10/44* (2006.01)

(52) U.S. Cl.
CPC .......... *H02J 7/0068* (2013.01); *G01R 31/367* (2019.01); *G01R 31/386* (2019.01); *H01M 10/4285* (2013.01); *H01M 10/44* (2013.01)

(58) Field of Classification Search
None
See application file for complete search history.

(56) References Cited

U.S. PATENT DOCUMENTS

| 2011/0316548 A1* | 12/2011 | Ghantous | H01M 10/44 324/427 |
| 2015/0212160 A1* | 7/2015 | Marsili | G01R 31/3835 324/427 |
| 2016/0139207 A1* | 5/2016 | Sano | G01R 31/367 702/63 |

* cited by examiner

*Primary Examiner* — Douglas X Rodriguez
(74) *Attorney, Agent, or Firm* — Veros Legal Solutions, LLP

(57) ABSTRACT

Certain embodiments are described that provide a method for measuring battery parameters under discharge/charge. (a) A battery at rest is provided having an initial State of Charge (SoC). (b) A discharge/charge excitation is applied for a first period of time. (c) The battery is allowed to rest for a second period of time. (d) A discharge/charge is applied, having a higher current and shorter duration than the discharge/charge of step (b). (e) The battery is allowed to rest for a third period of time. (f) Steps (b)-(d) are repeated. Parameters of the battery are measured during a plurality of the steps.

9 Claims, 5 Drawing Sheets

METHOD FOR MEASURING BATTERY PARAMETERS UNDER DISCHARGE OR CHARGE

CROSS-REFERENCE TO RELATED APPLICATIONS

This patent application claims the benefit of U.S. Provisional Patent Application No. 62/222,374 filed Sep. 23, 2015 and entitled "METHOD AND APPARATUS FOR DETERMINING BATTERY PARAMETERS," which is incorporated by reference herein in its entirety for all purposes.

BACKGROUND

Aspects of the disclosure relate generally to battery parameter measurements and more specifically to determining charging and discharging characteristics.

A Frequency Response Analyzer or FRA is used to obtain the parameters necessary for modeling electrochemical devices such as batteries. One issue with using an FRA for this purpose is that an FRA typically is unreliable because in most cases, the FRA is not capable of providing large enough current at low and high frequencies to properly charge/discharge the battery. Even when low-frequency, high-current FRA devices are used, inaccurate modeling of the parameters still occurs for low frequencies, especially for parameters measured under direct current conditions.

The present invention addresses these and other deficiencies of currently available battery testing systems.

SUMMARY

Certain embodiments are described that provide a method for measuring battery parameters under discharge. (a) A battery at rest is provided having an initial State of Charge (SoC). (b) A discharge excitation is applied for a first period of time. (c) The battery is allowed to rest for a second period of time. (d) A discharge is applied, having a higher current, and shorter duration than the discharge of step (b). (e) The battery is allowed to rest for a third period of time. (f) Steps (b)-(d) are repeated. Parameters of the battery are measured during a plurality of the steps.

Certain embodiments are described that provide a method for measuring battery parameters under charge. (a) A battery at rest is provided having an initial State of Charge (SoC). (b) A charge excitation is applied for a first period of time. (c) The battery is allowed to rest for a second period of time. (d) A charge is applied having a higher current, and shorter duration than the charge of step (b). (e) The battery is allowed to rest for a third period of time. (f) Steps (b)-(d) are repeated. (g) Parameters of the battery during a plurality of the steps.

BRIEF DESCRIPTION OF THE DRAWINGS

The structure and function of the invention can be best understood from the description herein in conjunction with the accompanying figures. The figures are not necessarily to scale, emphasis instead generally being placed upon illustrative principles. The figures are to be considered illustrative in all aspects and are not intended to limit the invention, the scope of which is defined only by the claims.

DETAILED DESCRIPTION

Examples are described herein in the context of battery testing. Those of ordinary skill in the art will realize that the following description is illustrative only and is not intended to be in any way limiting. Reference will now be made in detail to implementations of examples as illustrated in the accompanying drawings. The same reference indicators will be used throughout the drawings and the following description to refer to the same or like items.

In the interest of clarity, not all of the routine features of the examples described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another.

Figure 1:
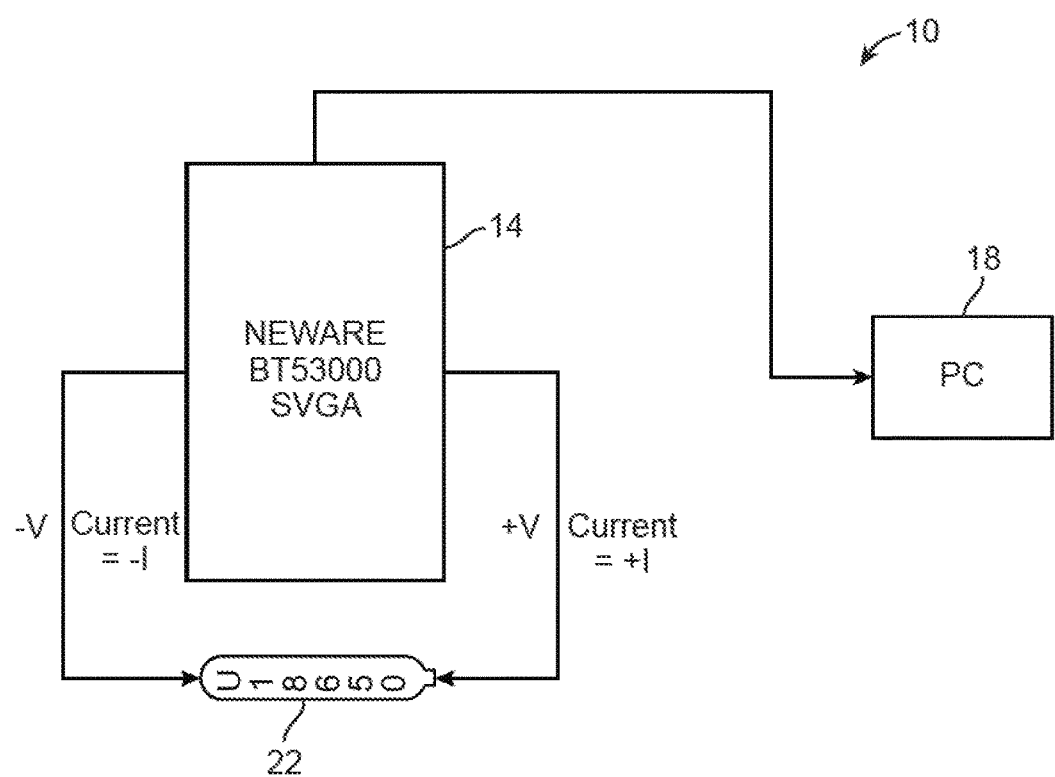
FIG. 1 is a block diagram of an embodiment of the testing system of the invention.

In brief overview and referring to FIG. 1, a battery testing system or testing system 10 constructed in accordance with an embodiment of the invention includes a five-volt, six-amp battery tester 14 such as a Neware BTS3000, (Neware Technology Limited, Xiameilin, Shenzhen, Guangdong, China). The battery tester 14 is under the control of a computer 18. A battery 22 to be tested is connected to the battery tester 14, which applies a voltage (±V) across the battery 22 and sources and sinks the resulting current flow (±I). The computer 18 then graphs the time evolution of charge and potential placed across the battery 22 in response to the excitations applied by the tester.

Figure 2:
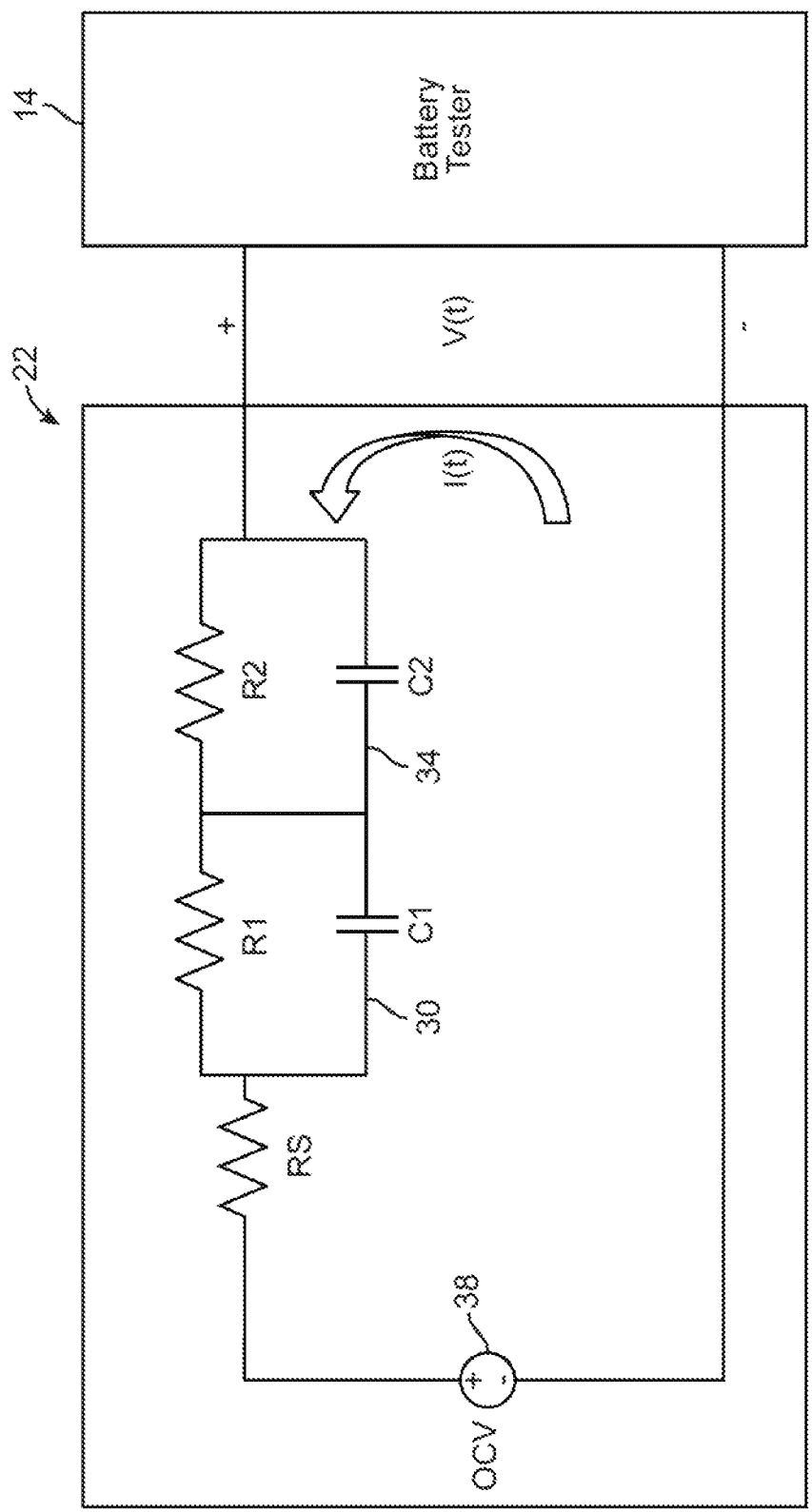
FIG. 2 is a model of a battery connected to the battery tester of FIG. 1.

Using this system, actual battery parameters may be obtained that help model the battery's performance. One model of a battery, the dual polarization model that is used to characterize a battery, is shown in FIG. 2, which is a standard circuit representation of a battery. The model includes an open circuit voltage source, OCV, an internal resistance Rs and two RC circuits (30, 34) connected in series. Each RC circuit (30, 34) includes a resistor (R1, R2) connected in parallel with a capacitor (C1, C2), respectively. The voltage drop across R1 is V1 and across R2 is V2. The voltage supplied by the OCV is VOCV and the voltage across the battery terminals is V(t). The current supplied by the battery is I(t).

One end of one of the RC circuits 30, 34 is connected in series with one end of resistor Rs. The open voltage source OCV 38 is connected in series with the other end of resistor Rs. The battery tester 14 is connected between one terminal of the OCV source 38 and one of the RC circuits 34. Although two RC circuits (30, 34) are shown in this model, for clarity other RC circuits may be added to the model. Adding additional RC circuits to the model may increase the accuracy of the model, depending upon the battery and its chemical components. For example, the addition of one RC circuit may reduce the error in the model by 36%.

The mathematical model of the battery then becomes:

$$V1 = -V1/(R1C1) + I(t)/C1$$

$$V2 = -V2/(R2C2) + I(t)/C2$$

$$V(t) = VOCV - V1 - V2 - I(t)Rs$$

The purpose of the method is then to measure the various parameters to permit the model to be evaluated.

According to at least one embodiment, two tests are performed: discharge and charge. The battery is initially at rest, preferably having at least 75% State of Charge (SoC), and more preferably having between 99% and 100% SoC. The battery tester then applies a discharge excitation at a low, constant discharge rate for a first period of time (e.g., a number of hours). The battery is then allowed to rest for a period of time, preferably at least 2 hours. After the rest period, a high current, short duration discharge is applied, preferably at least 10 times the low discharge rate (for example, less than 1 second). The battery is again allowed to rest for preferably at least 2 hours. The low discharge, rest, high discharge and rest steps are then repeated until the SoC of the battery is at a sufficiently low level, such as less than 25%, more preferably 10% or less, such as 0%-1%.

Figure 3A:
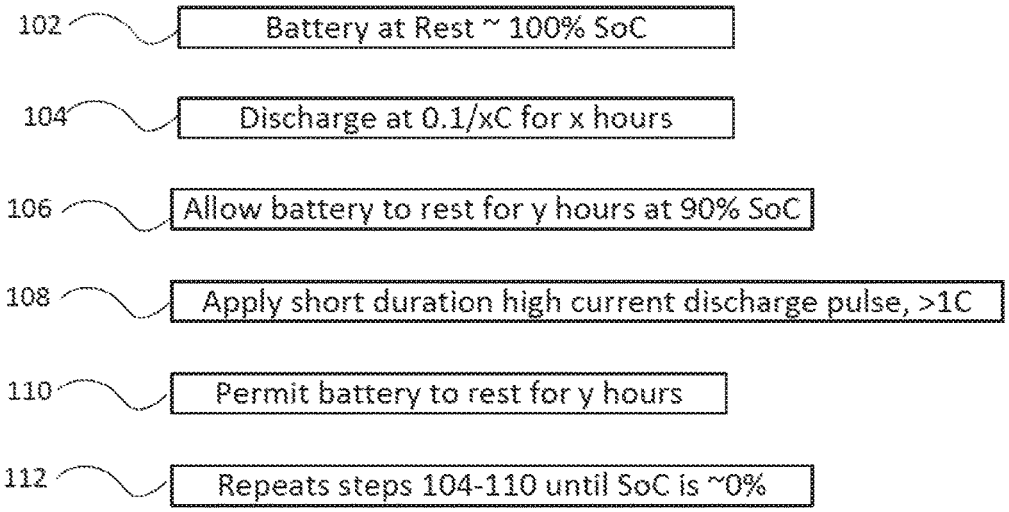
FIGS. 3A and 3B are flow diagrams of an embodiment of the steps of measuring battery parameters under discharge and charge conditions respectively.

Referring to FIG. 3A, in one embodiment for discharge testing, the battery is initially at rest having between 99% and 100% State of Charge (SoC) (Step 102). The battery tester then applies a discharge excitation (Step 104) of 0.1/x C for x hours, where C is the number of amperes needed to discharge the battery in an hour. For example, a battery might have 4.0 Ah (Ampere hours) of capacity. The C value is 4.0 Amps. Thus, 0.1/x C for x hours, with x=1, equates to a discharge of (0.1)(4.0)=0.40 Amps for 1 hour.

At the end of x hours, the battery is at 90% SoC and is allowed to rest for y hours (Step 106). Again, if the battery is a four amp-hr battery, to bring the charge to 90% requires the discharge of 400 mA over a time span of x hours (whatever amount of time is required to reach 90%). After the rest period of y hours, a high current, short duration discharge >1 C (for example, 1 C for 1 second) is applied (Step 108), and the battery is again allowed to rest for y hours (Step 110). Steps 104-110 are then repeated until the SoC of the battery is between 1% and 0% (Step 112).

In one embodiment, the invention includes measuring OCV at a resting voltage from step 106. In yet another embodiment, the invention includes measuring Rs from the instantaneous voltage change due to the high current pulse in step d. In still another embodiment, the invention includes measuring R1, C1, R2, and C2 by multi-exponentially modeling the depolarization curve in step 106.

Figure 3B:
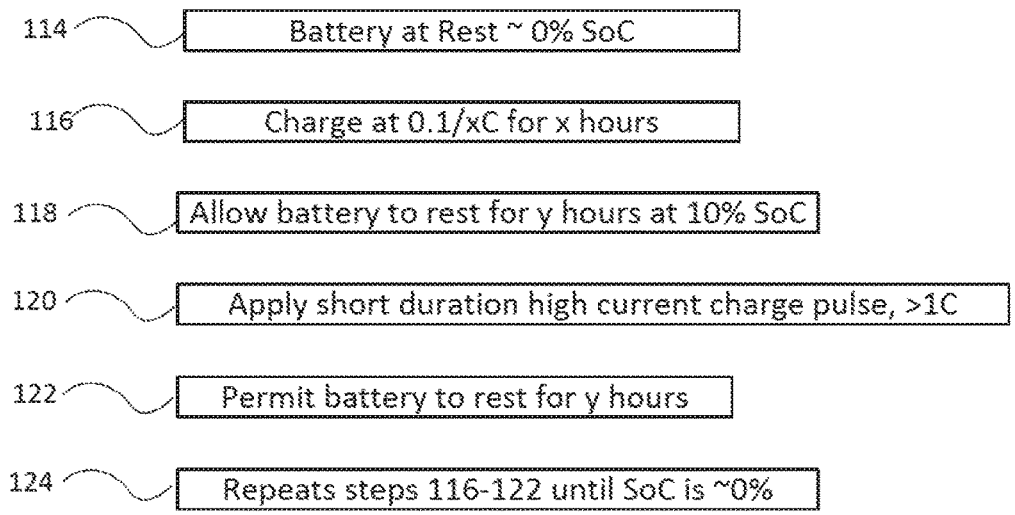

Referring to FIG. 3B, in one embodiment, the battery charge test is similar to the battery discharge test. The battery is initially at rest at about ~0% SoC (Step 114). A charge excitation of 0.1/x C is applied for x hours (Step 116). The battery is then allowed to rest for y hours at 10% SoC (Step 118). A short duration, high current charge pulse >1 C is then applied (Step 120), and the battery again allowed to rest for y hours (Step 122). Steps 116-122 are then repeated until SoC has charged to about ~100%. Measuring the parameters during both charging and discharging is useful to determine if the battery behaves differently under these operations. If parameter values measured under charging and discharging are close (within a margin of error, or within an expected hysteresis), the values of a parameter under charging and discharging may be averaged.

In another embodiment, the invention includes measuring OCV at a resting voltage from step 118. In yet another embodiment, the invention includes measuring Rs from the instantaneous voltage change due to the high current pulse during step 118. In still another embodiment, the invention includes measuring R1, C1, R2, and C2 by multi-exponentially modeling the depolarization curve in step 118.

Figure 4:
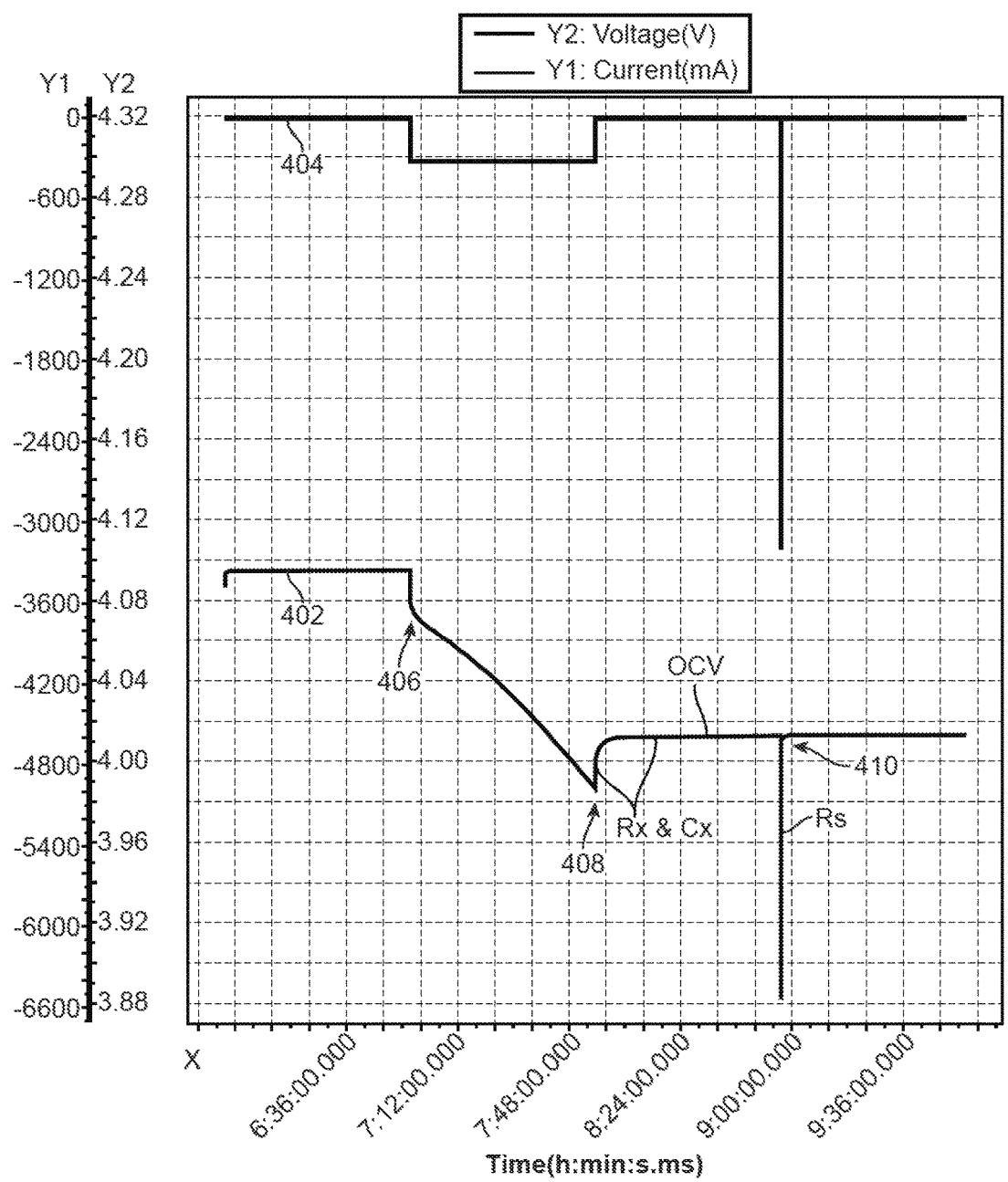
FIG. 4 is an exemplary plot of battery voltage input and response.

Referring also to FIG. 4, during these steps, the voltage of the battery is measured using a current method and all the parameters are derivable from this data extraction approach. Line 404 is the excitation current (mA) applied to the battery. Line 402 shows the resulting voltage. The current values for line 404 are shown on the left of the y axis (e.g., 0 mA to −6600 mA), while the voltage values for line 402 are shown on the right side of the y axis (e.g., 4.32 V to 3.88 V). The x axis shows elapsed time. At a point 406, the initial constant discharge excitation is applied (step 104 of FIG. 3A). The discharge stops at point 408, entering a rest period (step 106 in FIG. 3A). At point 410, the high current discharge pulse if applied (step 108), and thereafter the battery is allowed to rest again (step 110). This process can be used to get the battery SoC to 90%, where the parameters can be measured. The steps are then applied as many times as needed to get the battery SoC to 10%, where the parameters are again measured. Intervening values of the parameters can then be derived by interpolation. Alternately, the parameters can be measured at multiple intervening values of the SoC.

Assuming the dual polarization model for the battery, OCV is measured at a resting voltage in steps 106 and 118. Rs is measured from the instantaneous voltage change due to the high current pulse during steps 108 and 120. R1, C1, R2, and C2 are measured by multi-exponentially modeling the depolarization curve in steps 106 and 118. This modeling fits the decay constants to the depolarization curve when the current is 0 following the negative pulse (FIG. 4). Using the multiple equations described previously, the mathematical representation of the battery can be solved.

The charge/discharge rate at 0.1/x C for x hours was selected under the assumption that the battery's equivalent RCs are fully saturated. When this is the case, the battery parameters are measurable from the depolarization curve. As discussed above, the technique may be used with additional RCs in the model.

In one embodiment, the battery parameters are measured at 90% and 10% of battery charge, and interpolation is used to obtain the parameters for other values of battery charge. The measurement system described above, using both charging and discharging, should allow any hysteresis to cancel out. Optionally, separate hysteresis testing can also be performed.

The parameters x and y can be any number. While one embodiment uses the same parameter x in steps 104 and 116 of FIGS. 3A and 3B for the charge/discharge rate and amount of time, different values of x could also be used such that the amount of time can vary. According to certain embodiments, the amount of time y for the battery to rest is sufficiently long to allow the battery parameters to stabilize. In practice, for particular batteries tested, times longer than 2 hours are sufficient. However, shorter times may be used, such as for different or future batteries. Also, the length of the rest periods y can vary, so that the rest period of steps 106/118 can be different from the rest period of steps 110/122. In such embodiments, the only requirement is that both rest periods be sufficiently long to allow the battery parameters to stabilize.

Unless otherwise indicated, all numbers expressing lengths, widths, depths, or other dimensions and so forth used in the specification and claims are to be understood in all instances as indicating both the exact values as shown and as being modified by the term "about." Accordingly, unless indicated to the contrary, the numerical parameters set forth in the specification and attached claims are approximations that may vary depending upon the desired properties sought to be obtained. At the very least, and not as an attempt to limit the application of the doctrine of equivalents to the scope of the claims, each numerical parameter should at least be construed in light of the number of reported significant digits and by applying ordinary rounding techniques. Any specific value may vary by 20%.

Computer System

Figure 5:
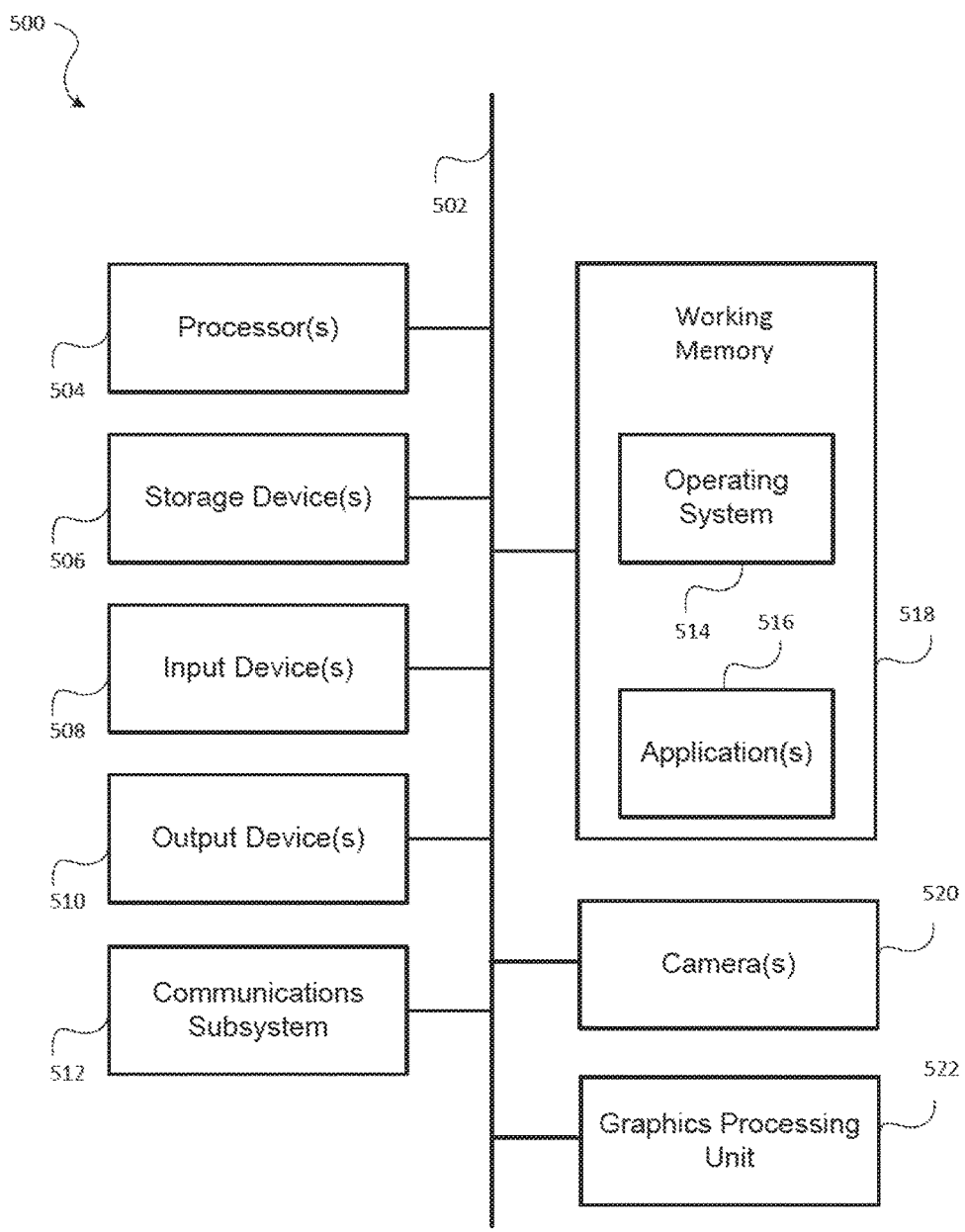
FIG. 5 illustrates an example of a computing system shown in FIG. 1 in which one or more embodiments may be implemented.

FIG. 5 illustrates an example of a computing system in which one or more implementations may be implemented.

A computer system as illustrated in FIG. 5 may be incorporated as part of the above described Personal Computer 18 of FIG. 1. For example, computer system 500 can represent some of the components of a display, a computing device, a server, a desktop, a workstation, a control or interaction system in an automobile, a tablet, a netbook or any other suitable computing system. A computing device may be any computing device with an image capture device or input sensory unit and a user output device. An image capture device or input sensory unit may be a camera device. A user output device may be a display unit. Examples of a computing device include but are not limited to video game consoles, tablets, smart phones and any other hand-held devices. FIG. 5 provides a schematic illustration of one implementation of a computer system 500 that can perform the methods provided by various other implementations, as described herein, and/or can function as the host computer system, a remote kiosk/terminal, a telephonic or navigation or multimedia interface in an automobile, a computing device, a set-top box, a table computer and/or a computer system. FIG. 5 is meant only to provide a generalized illustration of various components, any or all of which may be utilized as appropriate. FIG. 5, therefore, broadly illustrates how individual system elements may be implemented in a relatively separated or relatively more integrated manner.

The computer system 500 is shown comprising hardware elements that can be electrically coupled via a bus 502 (or may otherwise be in communication, as appropriate). The hardware elements may include one or more processors 504, including without limitation one or more general-purpose processors and/or one or more special-purpose processors (such as digital signal processing chips, graphics processing units 522, and/or the like); one or more input devices 508, which can include without limitation one or more cameras, sensors, a mouse, a keyboard, a microphone configured to detect ultrasound or other sounds, and/or the like; and one or more output devices 510, which can include without limitation a display unit such as the device used in implementations of the invention, a printer and/or the like. Additional cameras 520 may be employed for detection of user's extremities and gestures. In some implementations, input devices 508 may include one or more sensors such as infrared, depth, and/or ultrasound sensors. The graphics processing unit 522 may be used to carry out the method for real-time wiping and replacement of objects described above.

In some implementations of the implementations of the invention, various input devices 508 and output devices 510 may be embedded into interfaces such as display devices, tables, floors, walls, and window screens. Furthermore, input devices 408 and output devices 510 coupled to the processors may form multi-dimensional tracking systems.

The computer system 500 may further include (and/or be in communication with) one or more non-transitory storage devices 506, which can comprise, without limitation, local and/or network accessible storage, and/or can include, without limitation, a disk drive, a drive array, an optical storage device, a solid-state storage device such as a random access memory ("RAM") and/or a read-only memory ("ROM"), which can be programmable, flash-updateable and/or the like. Such storage devices may be configured to implement any appropriate data storage, including without limitation, various file systems, database structures, and/or the like.

The computer system 500 might also include a communications subsystem 512, which can include without limitation a modem, a network card (wireless or wired), an infrared communication device, a wireless communication device and/or chipset (such as a Bluetooth device, an 802.11 device, a Wi-Fi device, a WiMax device, cellular communication facilities, etc.), and/or the like. The communications subsystem 512 may permit data to be exchanged with a network, other computer systems, and/or any other devices described herein. In many implementations, the computer system 500 will further comprise a non-transitory working memory 518, which can include a RAM or ROM device, as described above.

The computer system 500 also can comprise software elements, shown as being currently located within the working memory 518, including an operating system 514, device drivers, executable libraries, and/or other code, such as one or more application programs 516, which may comprise computer programs provided by various implementations, and/or may be designed to implement methods, and/or configure systems, provided by other implementations, as described herein. Merely by way of example, one or more procedures described with respect to the method(s) discussed above might be implemented as code and/or instructions executable by a computer (and/or a processor within a computer); in an aspect, then, such code and/or instructions can be used to configure and/or adapt a general purpose computer (or other device) to perform one or more operations in accordance with the described methods.

A set of these instructions and/or code might be stored on a computer-readable storage medium, such as the storage device(s) 506 described above. In some cases, the storage medium might be incorporated within a computer system, such as computer system 500. In other implementations, the storage medium might be separate from a computer system (e.g., a removable medium, such as a compact disc), and/or provided in an installation package, such that the storage medium can be used to program, configure and/or adapt a general purpose computer with the instructions/code stored thereon. These instructions might take the form of executable code, which may be executable by the computer system 500 and/or might take the form of source and/or installable code, which, upon compilation and/or installation on the computer system 500 (e.g., using any of a variety of generally available compilers, installation programs, compression/decompression utilities, etc.) then takes the form of executable code.

Substantial variations may be made in accordance with specific requirements. For example, customized hardware might also be used, and/or particular elements might be implemented in hardware, software (including portable software, such as applets, etc.), or both. Further, connection to other computing devices such as network input/output devices may be employed. In some implementations, one or more elements of the computer system 500 may be omitted or may be implemented separate from the illustrated system.

For example, the processor 504 and/or other elements may be implemented separate from the input device 508. In one implementation, the processor may be configured to receive images from one or more cameras that are separately implemented. In some implementations, elements in addition to those illustrated in FIG. 5 may be included in the computer system 500.

Some implementations may employ a computer system (such as the computer system 500) to perform methods in accordance with the disclosure. For example, some or all of the procedures of the described methods may be performed by the computer system 500 in response to processor 504 executing one or more sequences of one or more instructions (which might be incorporated into the operating system 514 and/or other code, such as an application program 516) contained in the working memory 518. Such instructions may be read into the working memory 518 from another computer-readable medium, such as one or more of the storage device(s) 506. Merely by way of example, execution of the sequences of instructions contained in the working memory 518 might cause the processor(s) 504 to perform one or more procedures of the methods described herein.

The terms "machine-readable medium" and "computer-readable medium," as used herein, refer to any medium that participates in providing data that causes a machine to operate in a specific fashion. In some implementations implemented using the computer system 500, various computer-readable media might be involved in providing instructions/code to processor(s) 504 for execution and/or might be used to store and/or carry such instructions/code (e.g., as signals). In many implementations, a computer-readable medium may be a physical and/or tangible storage medium. Such a medium may take many forms, including but not limited to, non-volatile media, volatile media, and transmission media. Non-volatile media include, for example, optical and/or magnetic disks, such as the storage device(s) 506. Volatile media include, without limitation, dynamic memory, such as the working memory 518. Transmission media include, without limitation, coaxial cables, copper wire and fiber optics, including the wires that comprise the bus 502, as well as the various components of the communications subsystem 512 (and/or the media by which the communications subsystem 512 provides communication with other devices). Hence, transmission media can also take the form of waves (including without limitation radio, acoustic and/or light waves, such as those generated during radio-wave and infrared data communications).

Common forms of physical and/or tangible computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, a PROM, EPROM, a FLASH-EPROM, any other memory chip or cartridge, a carrier wave as described hereinafter, or any other medium from which a computer can read instructions and/or code.

Various forms of computer-readable media may be involved in carrying one or more sequences of one or more instructions to the processor(s) 504 for execution. Merely by way of example, the instructions may initially be carried on a magnetic disk and/or optical disc of a remote computer. A remote computer might load the instructions into its dynamic memory and send the instructions as signals over a transmission medium to be received and/or executed by the computer system 500. These signals, which might be in the form of electromagnetic signals, acoustic signals, optical signals and/or the like, are all examples of carrier waves on which instructions can be encoded, in accordance with various implementations of the invention.

The communications subsystem 512 (and/or components thereof) generally will receive the signals, and the bus 502 then might carry the signals (and/or the data, instructions, etc. carried by the signals) to the working memory 518, from which the processor(s) 504 retrieves and executes the instructions. The instructions received by the working memory 518 may optionally be stored on a non-transitory storage device 406 either before or after execution by the processor(s) 504.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Moreover, nothing disclosed herein is intended to be dedicated to the public.

While some examples of methods and systems herein are described in terms of software executing on various machines, the methods and systems may also be implemented as specifically-configured hardware, such as field-programmable gate array (FPGA) specifically to execute the various methods. For example, examples can be implemented in digital electronic circuitry, or in computer hardware, firmware, software, or in a combination thereof. In one example, a device may include a processor or processors. The processor comprises a computer-readable medium, such as a random access memory (RAM) coupled to the processor. The processor executes computer-executable program instructions stored in memory, such as executing one or more computer programs. Such processors may comprise a microprocessor, a digital signal processor (DSP), an application-specific integrated circuit (ASIC), field programmable gate arrays (FPGAs), and state machines. Such processors may further comprise programmable electronic devices such as PLCs, programmable interrupt controllers (PICs), programmable logic devices (PLDs), programmable read-only memories (PROMs), electronically programmable read-only memories (EPROMs or EEPROMs), or other similar devices.

Such processors may comprise, or may be in communication with, media, for example computer-readable storage media, that may store instructions that, when executed by the processor, can cause the processor to perform the steps described herein as carried out, or assisted, by a processor. Examples of computer-readable media may include, but are not limited to, an electronic, optical, magnetic, or other storage device capable of providing a processor, such as the processor in a web server, with computer-readable instructions. Other examples of media comprise, but are not limited to, a floppy disk, CD-ROM, magnetic disk, memory chip, ROM, RAM, ASIC, configured processor, all optical media, all magnetic tape or other magnetic media, or any other medium from which a computer processor can read. The processor, and the processing, described may be in one or more structures, and may be dispersed through one or more structures. The processor may comprise code for carrying out one or more of the methods (or parts of methods) described herein.

The foregoing description of some examples has been presented only for the purpose of illustration and description and is not intended to be exhaustive or to limit the disclosure to the precise forms disclosed. Numerous modifications and adaptations thereof will be apparent to those skilled in the art without departing from the spirit and scope of the disclosure.

Reference herein to an example or implementation means that a particular feature, structure, operation, or other characteristic described in connection with the example may be included in at least one implementation of the disclosure. The disclosure is not restricted to the particular examples or implementations described as such. The appearance of the phrases "in one example," "in an example," "in one implementation," or "in an implementation," or variations of the same in various places in the specification does not necessarily refer to the same example or implementation. Any particular feature, structure, operation, or other characteristic described in this specification in relation to one example or implementation may be combined with other features, structures, operations, or other characteristics described in respect of any other example or implementation.

Use herein of the word "or" is intended to cover inclusive and exclusive OR conditions. In other words, A or B or C includes any or all of the following alternative combinations as appropriate for a particular usage: A alone; B alone; C alone; A and B only; A and C only; B and C only; and A and B and C.

The terms "a," "an," "the," and similar referents used in the context of describing the invention (especially in the context of the following claims) are to be construed to cover both the singular and the plural, unless otherwise indicated herein or clearly contradicted by context. All methods described herein can be performed in any suitable order unless otherwise indicated herein or otherwise clearly contradicted by context. The use of any and all examples, or exemplary language (e.g., "such as") provided herein is intended merely to better illuminate the invention and does not pose a limitation on the scope of any claim. No language in the specification should be construed as indicating any non-claimed element essential to the practice of the invention.

Groupings of alternative elements or embodiments disclosed herein are not to be construed as limitations. Each group member may be referred to and claimed individually or in any combination with other members of the group or other elements found herein. It is anticipated that one or more members of a group may be included in, or deleted from, a group for reasons of convenience and/or patentability. When any such inclusion or deletion occurs, the specification is deemed to contain the group as modified, thus fulfilling the written description of all Markush groups used in the appended claims.

Certain embodiments are described herein, including the best mode known to the inventor for carrying out the spirit of the present disclosure. Of course, variations on these described embodiments will become apparent to those of ordinary skill in the art upon reading the foregoing description. The inventor expects skilled artisans to employ such variations as appropriate, and the inventor intends for the invention to be practiced otherwise than specifically described herein. Accordingly, the claims include all modifications and equivalents of the subject matter recited in the claims as permitted by applicable law. Moreover, any combination of the above-described elements in all possible variations thereof is contemplated unless otherwise indicated herein or otherwise clearly contradicted by context.

In closing, it is to be understood that the embodiments disclosed herein are illustrative of the principles of the claims. Other modifications that may be employed are within the scope of the claims. Thus, by way of example, but not of limitation, alternative embodiments may be utilized in accordance with the teachings herein. Accordingly, the claims are not limited to embodiments precisely as shown and described.

What is claimed is:

1. A method for measuring battery parameters under discharge comprising:
   (a) providing a battery at rest having an initial State of Charge (SoC);
   (b) applying a discharge excitation for a first period of time;
   (c) allowing the battery to rest for a second period of time;
   (d) applying a discharge having a higher current, and shorter duration than the discharge of step (b);
   (e) allowing the battery to rest for a third period of time;
   (f) repeating steps (b)-(d) until the initial SoC is less than 1%; and
   (g) measuring parameters of the battery during a plurality of the steps;
   wherein:
   (a) the initial State of Charge (SoC) is about 100%;
   (b) applying the discharge excitation for the first period of time comprises applying a discharge excitation of 0.1/x C discharge for x hours, where C is the number of amperes needed to completely discharge the battery in x hours;
   (c) allowing the battery to rest for the second period of time comprises allowing the battery to rest for y hours, which is greater than 0;
   (d) applying the discharge having the higher current and shorter duration comprises applying a discharge >1 C; and
   (e) allowing the battery to rest for the third period of time comprises allowing the battery to rest for y hours.

2. The method of claim 1 wherein a rate of discharge of step (d) is at least 10 times a rate of discharge of step (b).

3. The method of claim 1 wherein the initial SoC is greater than 75%.

4. The method of claim 1 wherein the second and third periods of time are the same, and are at least two hours.

5. The method of claim 1 wherein the battery is modeled with an Open Circuit Voltage (OCV) source in series with an internal resistance (Rs) and two RC circuits in series (R1, C1, R2, C2) and further comprising measuring the OCV at a resting voltage from step c.

6. The method of claim 5 wherein measuring parameters of the battery comprises measuring Rs from the instantaneous voltage change due to the high current pulse during step (d).

7. The method of claim 5 wherein measuring parameters of the battery comprises measuring R1, C1, R2, and C2 by multi-exponentially modeling a depolarization curve during step (c).

8. A non-transitory computer readable medium having computer readable code stored thereon which, when executed by a processor, causes the processor to control a test apparatus in measuring battery parameters under discharge by:
   (a) providing a battery at rest having an initial State of Charge (SoC);

(b) applying a discharge excitation for a first period of time;

(c) allowing the battery to rest for a second period of time;

(d) applying a discharge having a higher current, and shorter duration than the discharge of step (b);

(e) allowing the battery to rest for a third period of time;

(f) repeating steps (b)-(d) until the initial SoC is less than 1%; and (g) measuring parameters of the battery during a plurality of the steps;

wherein:

(a) the initial State of Charge (SoC) is about 100%;

(b) applying the discharge excitation for the first period of time comprises applying a discharge excitation of $0.1/x$ C discharge for x hours, where C is the number of amperes needed to completely discharge the battery in x hours;

(c) allowing the battery to rest for the second period of time comprises allowing the battery to rest for y hours, which is greater than 0;

(d) applying the discharge having the higher current and shorter duration comprises applying a discharge >1 C; and (e) allowing the battery to rest for the third period of time comprises allowing the battery to rest for y hours.

9. The non-transitory computer readable medium of claim 8 wherein the battery is modeled with an Open Circuit Voltage (OCV) source in series with an internal resistance (Rs) and two RC circuits in series (R1, C1, R2, C2), and wherein measuring parameters of the battery comprises: measuring OCV at a resting voltage from step (c), measuring Rs from the instantaneous voltage change due to the high current pulse during step (d); and measuring R1, C1, R2, and C2 by multi-exponentially modeling a depolarization curve during step (c).

\* \* \* \* \*